United States Patent
Bae et al.

(10) Patent No.: US 6,285,914 B1
(45) Date of Patent: Sep. 4, 2001

(54) VERIFICATION METHOD BY MEANS OF COMPARING INTERNAL STATE TRACES

(75) Inventors: Jong Hong Bae; Tae Hun Jin, both of Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/221,873

(22) Filed: Dec. 29, 1998

(30) Foreign Application Priority Data

Dec. 30, 1997 (KR) .................................................. 97-77919

(51) Int. Cl.[7] .................................................. G05B 19/00
(52) U.S. Cl. .................................. 700/121; 716/5; 713/14
(58) Field of Search .............................. 700/30, 121, 97, 700/109, 110, 79, 80; 716/1, 4, 5, 18; 703/13–16; 714/33, 37, 45, 724, 732

(56) References Cited

U.S. PATENT DOCUMENTS

| 4,725,971 | 2/1988 | Doshi et al. ........................... 364/578 |
| 5,008,810 | 4/1991 | Kessel et al. ........................... 364/200 |
| 5,448,978 | 9/1995 | Hasegawa et al. ................... 123/480 |
| 5,539,680 | 7/1996 | Palnitkar et al. ..................... 364/578 |
| 5,845,064 | * 12/1998 | Huggins ................................ 714/33 |
| 6,044,211 | * 3/2000 | Jain ......................................... 716/18 |
| 6,141,630 | * 10/2000 | McNamara et al. .................... 703/14 |

* cited by examiner

*Primary Examiner*—Paul P. Gordon
*Assistant Examiner*—Steven R. Garland
(74) *Attorney, Agent, or Firm*—Jacobson Holman, PLLC

(57) ABSTRACT

A chip verification method by comparing internal state traces of chips having various functions, which is capable of reducing the overall chip designing and verifying time and attaining a more exact verification. The chip verification method in a chip design stage includes a first step of executing an application program for each of a target system having a target chip and a system having a function verification chip model of a design stage, using a virtual system modeled by a hardware description language; a second step of storing an internal state of the target chip on a command-by-command basis during execution of the application program and generating a trace file; a third step of comparing the internal state of the target chip stored at the trace file and an internal state of the function verification chip model on a command-by-command basis; and a fourth step of continuing execution of the program if the respective internal states are the same from the above comparison result, and if different, outputting the internal state and ending execution.

2 Claims, 3 Drawing Sheets

VERIFICATION METHOD BY MEANS OF COMPARING INTERNAL STATE TRACES

FIELD OF THE INVENTION

The Present invention relates to function verification of chip models such as models designed about microprogram control units or microprocessors, in a design stage, or a packaging test of an actual chip embodiment; and, more particularly, to a chip verification method by means of comparing internal state traces of chips.

DESCRIPTION OF THE PRIOR ART

In a conventional function verification method for design and function verification of chips such as microprogram control units (hereinafter, referred to as 'MCU') having complicated functions, etc., a simulation is executed by applying a test vector to a designed MCU model. Such a method may be performed as shown in FIG. 1 in such a way that a virtual system provided by modeling a system containing an MCU model through use of a hardware description language (hereinafter, referred to as 'HDL') is simulated, and that a predicated final result and a simulated final result are compared.

However, such a conventional verification method requires considerable time for its verification since the comparison can be fulfilled only after completion of all simulations. A method for adding a comparison process in the midst of the simulation has been proposed to overcome such a problem, but such an approach makes it difficult to ensure exact comparison data.

SUMMARY OF THE INVENTION

It is, therefore, a primary object of the invention to provide a chip verification method by means of comparing internal state traces of chips, in which overall designing time of chips having various functions can be reduced and a more exact verification of the chips can be executed.

In accordance with the present invention for achieving the above object, a chip verification method by means of comparing internal state traces of chips is provided. The method, in a chip design stage, includes a first step of executing an application program for each of a target system having a target chip and a system having a function verification chip model of a design stage, by using a virtual system modeled by a hardware description language; a second step of storing an internal state of the target chip on a command-by-command basis during performance of the application program executed in the first step and generating a trace file; a third step of comparing the internal state of the target chip stored in the trace file and an internal state of the chip model to be functionally verified, on a command-by-command basis; and a fourth step of continuing execution of the program if the respective internal states are determined, from the above comparison result, to be the same and if different, outputting the internal state and ending execution of the program.

In the present invention for attaining the above object, the chip verification method, in a chip packaging test stage, includes a first step of executing an application program for each of a first target system having a target chip and a second target system having a packaging test chip; a second step of storing an internal state of the target chip on a command-by-command basis during performance of the application program executed in the first step and generating a trace file; a third step of comparing the internal state of the target chip stored in the trace file with an internal state of the packaging test chip on a command-by-command basis; and a fourth step of continuing execution of the program if the respective internal states are determined, from the above comparison result, to be the same and if different, outputting the internal state and ending execution of the program.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

The present invention is described in detail as follows, referring to the accompanying drawings.

Figure 1:
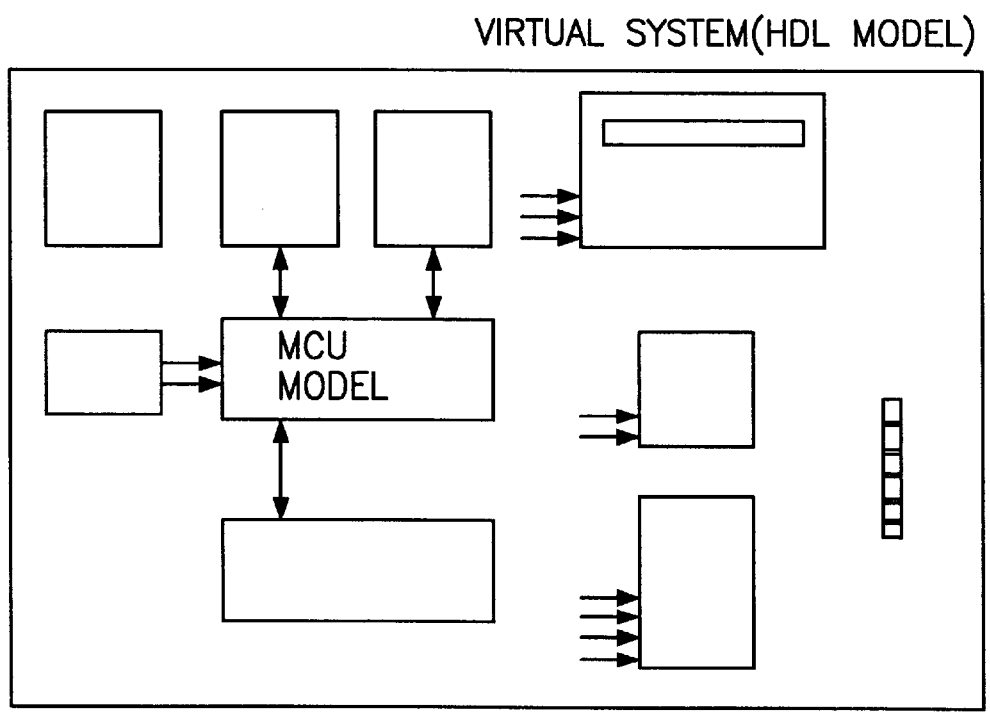
FIG. 1 is a block diagram conceptually showing a function verification method of chips based on a conventional technique.
Figure 2:
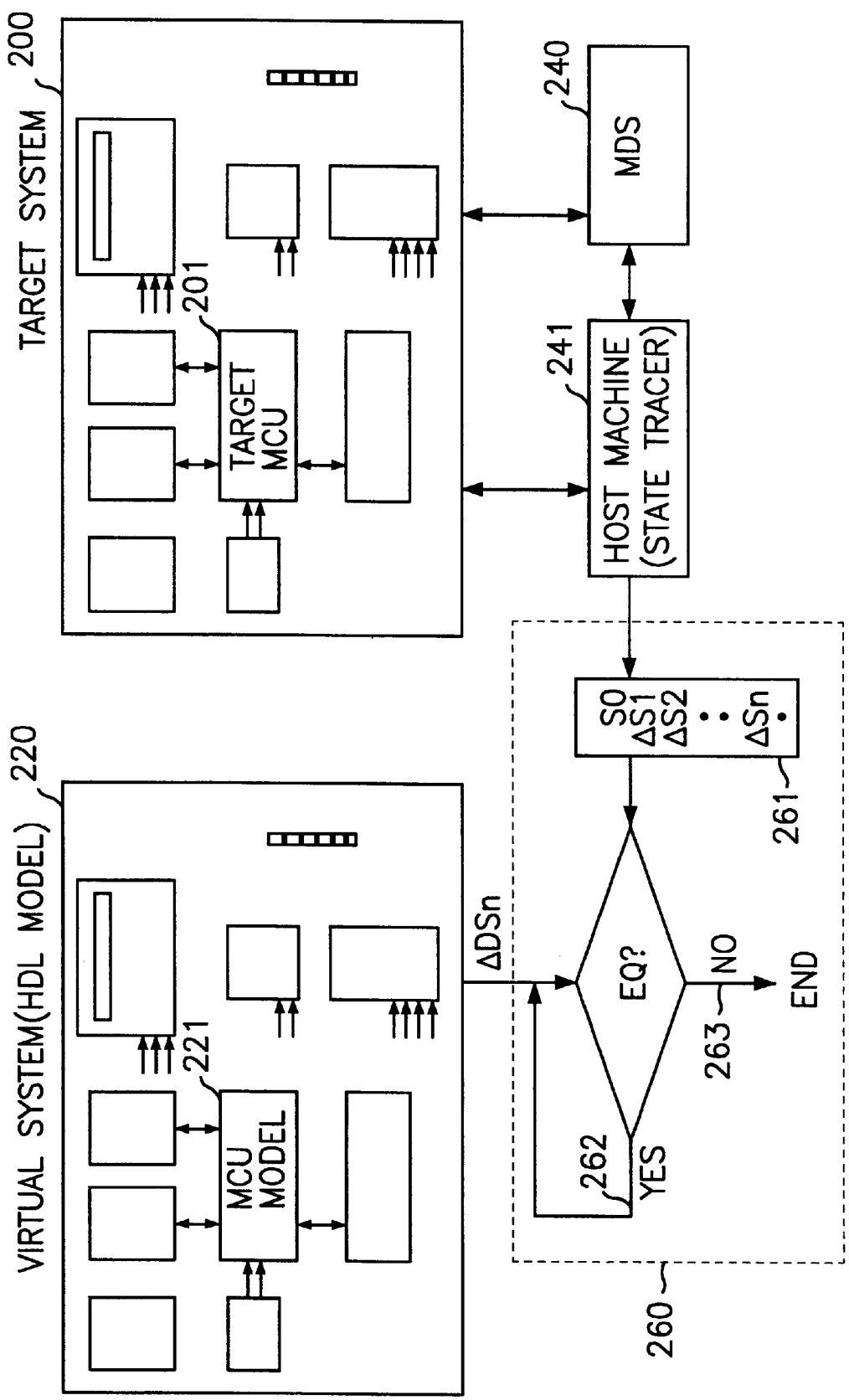
FIG. 2 represents a block diagram conceptually showing a function verification method executed in a chip design stage in accordance with the present invention.

FIG. 2 conceptually illustrates system for performing a function verification by comparing internal state traces of chips applied to an MCU design stage. The comparison of the internal state traces is performed by executing the same application program for each of a target MCU chip and a function verification MCU model. A change of each internal state, e.g., data stored at a register, etc., of the target MCU chip and the MCU model, is traced on a command-by-command basis during execution of the application program, and the tracing results are compared with each other.

Referring to FIG. 2, an application program is executed by employing a target system 200 having a target MCU chip 201. An internal state of the target MCU 201 resulting from program execution is stored on a command-by-command basis through a micro-processor development system (MDS) 240 and a state tracer of a host machine 241, to thereby generate a trace file 261. In order to reduce the size of the trace file 261 storing the internal state, an overall internal state $S_0$ is stored initially, and after that, only a state difference $DS_n$ between internal states after an execution of a previous command n−1 and after a completion of a current command n is stored.

In addition, a system having a function verification MCU model 221 is simulated by the same application program through a virtual system 220 modeled by an HDL. In the simulation performance, an internal state $DDS_n$ of the MCU model 221 designed by the HDL, to be verified, and contents of the trace file 261 of the target MCU are compared with each other on a command-by-command basis by using a state checker 260. Then, if the comparison result shows a match, the simulation continues, step 262, and if the results are different, the internal state is outputted and the simulation is ended, step 263.

Figure 3:
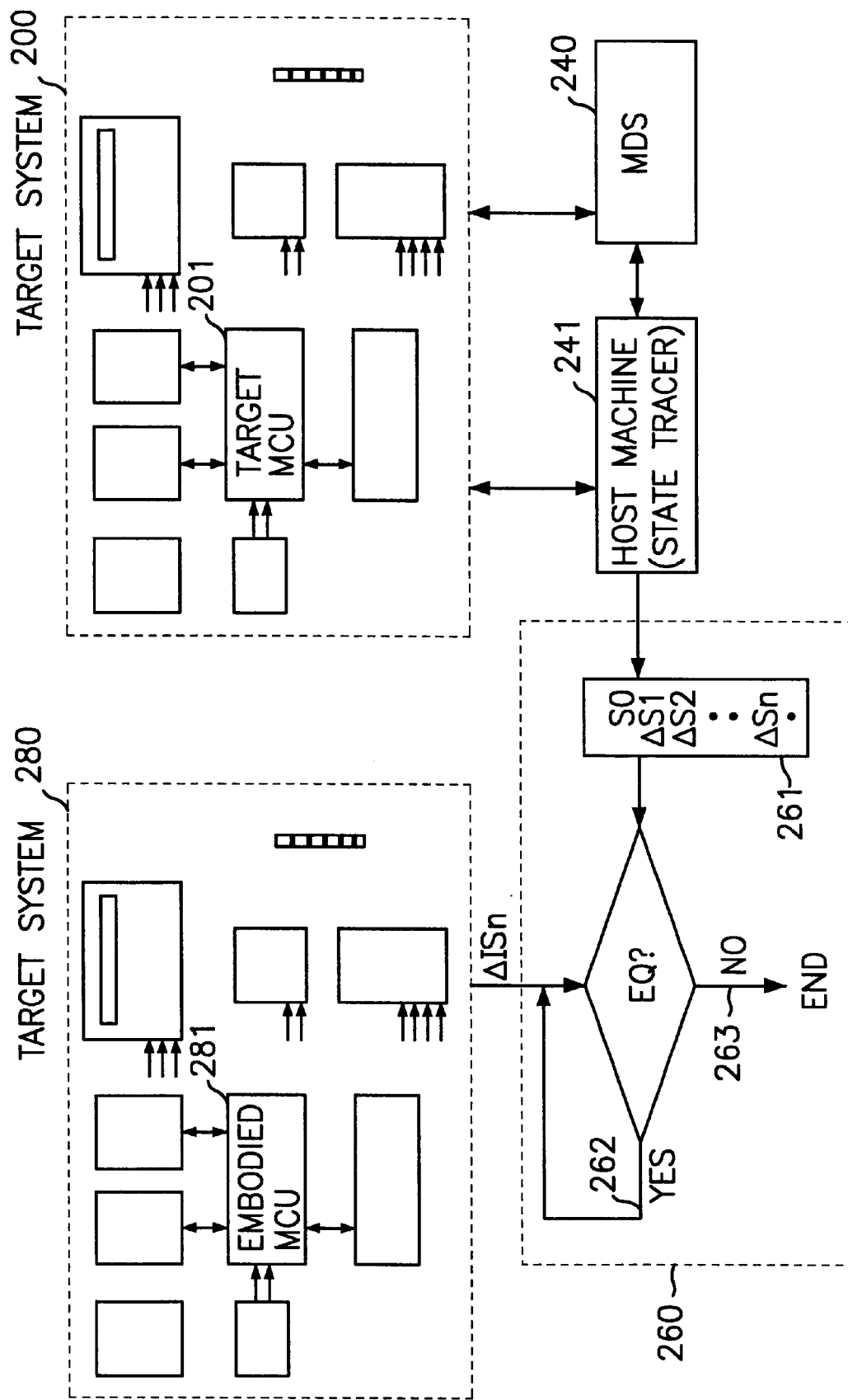
FIG. 3 depicts a block diagram conceptually showing a function verification method performed in a packaging test stage of chips in accordance with the present invention.

FIG. 3 conceptually shows a function verification method by means of comparing internal state traces of chips, which is applied to an MCU chip in a chip packaging test stage. The comparison of the internal state traces here indicates that the same application program is executed for each of a target MCU chip and the actual embodiment of a packaging test MCU chip. A change of each internal state, e.g., data stored at a register, etc., of the target MCU chip and the actually embodied MCU chip, is traced on a command-by-command basis during execution of the application program, and the tracing results are compared with each other.

In FIG. 3, as in FIG. 2, an application program is executed by employing a target system 200 having a target MCU chip. An internal state of the target MCU 201 resulting from program execution is stored on a command-by-command basis through an MDS 240 and a state tracer of a host machine 241, to whereby generate a trace file 261.

In executing a packaging test, also, an actually embodied MCU chip 281 is installed in a target system 280, and then, respective commands of the same application program are performed therein through a state checker 260. Simultaneously, an internal state $DIS_n$ of the embodied MCU chip 281 and contents of the trace file 261 for the target MCU chip 201 are compared correspondingly with the execution of the commands. If the comparison result shows a match, the test continues, step 262, and if the results are different, the internal state is outputted and the test is ended, step 263.

In accordance with the present invention aforementioned, an execution result of an actual target system can be compared with results from a verification simulation of a chip model having various functions or form an embodied chip packaging test, right after the respective commands are performed, to thereby reduce the overall designing time and the verification time of chips and also attain a more exact verification through a comparison with accurate reference data at a point in time corresponding with error occurrence.

Although the invention has been show and described with respect to the preferred embodiments, it will be understood by those skilled in the art that various changes and modifications may be made without departing from the spirit and scope of the invention as defined in the following claims.

What is claimed is:

1. A method for chip verification by comparing internal state traces of chips, in a chip design stage, comprising the steps of:

a) performing an application program for each of a target system having a target chip and a system having a function verification chip model of a design stage, using a virtual system modeled by a hardware description language;

b) storing an internal state of said target chip on a command-by-command basis during execution of said application program and generating a trace file;

c) comparing the internal state of the target chip stored in said trace file with an internal state of the function verification chip model on a command-by-command basis;

d) continuing execution of the said application program if the respective internal states compared in step c) are the same; and e) outputting the internal state and ending execution if the respective internal states compared in step c) are different, wherein an overall internal state of said target chip is stored initially, and after that, only a state difference between the internal states after and execution of a previous command and after completion of a current commend is stored, thereby reducing a size of said trace file.

2. A method for chip verification by comparing internal state traces of chips, in a chip packaging test stage, comprising the steps of:

a) performing an application program for each of a first target system having a target chip and a second target system having a packaging test chip;

b) storing an internal state of said target chip on a command-by-command basis during execution of said application program and generating a trace file;

c) comparing the internal state of the target chip stored in said trace file with an internal state of the packaging test chip on a command-by-command basis;

d) continuing execution of the program if the respective internal states compared in step c) are the same; and e) outputting the internal state and ending execution if the respective internal states compared in step c) are different, wherein an overall internal sate of said target chip is stored initially, and after that, only a state difference between the internal states after an execution of a previous command and after completion of a current command is stored, thereby reducing a size of said trace file.

* * * * *